(12) United States Patent
Scheiberlich et al.

(10) Patent No.: US 6,721,036 B2
(45) Date of Patent: Apr. 13, 2004

(54) LITHOGRAPHIC APPARATUS, DEVICE MANUFACTURING METHOD, AND DEVICE MANUFACTURED THEREBY

(75) Inventors: Arie C. Scheiberlich, Veldhoven (NL); Menno Fien, Goirle (NL); Evert H. J. Draaijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 17 days.

(21) Appl. No.: 09/827,350

(22) Filed: Apr. 6, 2001

(65) Prior Publication Data

US 2002/0039694 A1 Apr. 4, 2002

(30) Foreign Application Priority Data

Apr. 10, 2001 (EP) .............................................. 00302996

(51) Int. Cl.[7] ........................ G03B 27/42; G03B 27/54; G03B 27/72

(52) U.S. Cl. .............................. 355/53; 355/67; 355/71

(58) Field of Search ............................. 355/52, 53, 55, 355/67–71, 72, 75; 356/399–401; 250/201.4, 548

(56) References Cited

U.S. PATENT DOCUMENTS

| | | | | |
|---|---|---|---|---|
| 5,191,200 A | * | 3/1993 | Van der Werf et al. .. | 250/201.4 |
| 5,461,237 A | * | 10/1995 | Wakamoto et al. ......... | 250/548 |
| 5,502,311 A | * | 3/1996 | Imai et al. .................. | 250/548 |
| 5,777,721 A | * | 7/1998 | Makinouchi ................. | 355/53 |
| 6,400,456 B1 | * | 6/2002 | Miyachi ...................... | 356/399 |

* cited by examiner

Primary Examiner—Henry Hung Nguyen
(74) Attorney, Agent, or Firm—Pillsbury Winthrop LLP (57) ABSTRACT

On-the-Fly leveling in a lithographic apparatus is conducted using a setpoint derived by filtering the output of the combination of the output of a level sensor and another position sensor (LVDT or IFM). The level sensor may include look-ahead. The filter may be a low pass filter to cut-off level variations of wavelength shorter than the width of the slit during a scanning exposure. The filter may also be selected to reduce cross-talk between tilt movements and horizontal displacements.

17 Claims, 10 Drawing Sheets

|  |  | Example 1 | | | Example 2 | | |
|---|---|---|---|---|---|---|---|
| Z |  |  |  |  |  |  |  |
| y_l_a |  | 2.8 mm | | | 2.8 mm | | |
| wsf |  | notch 1 | notch 2 | notch 3 | notch 1 | notch 2 | notch 3 |
|  | zero f [Hz] | 47 | 1000 | nu | 47 | 1000 | nu |
|  | zero damp | 0.01 | 0.1 |  | 0.01 | 0.1 |  |
|  | pole f [Hz] | 40 | 50 |  | 40 | 50 |  |
|  | pole damp | 0.8 | 0.7 |  | 0.8 | 0.7 |  |
|  |  |  |  |  |  |  |  |
| Ry |  |  |  |  |  |  |  |
| y_l_a |  | 3.5 mm | | | 3.5 mm | | |
| wsf |  | notch 1 | notch 2 | notch 3 | notch 1 | notch 2 | notch 3 |
|  | zero f [Hz] | 47 | 1000 | nu | 47 | 1000 | nu |
|  | zero damp | 0.01 | 0.1 |  | 0.01 | 0.1 |  |
|  | pole f [Hz] | 35 | 50 |  | 35 | 50 |  |
|  | pole damp | 1 | 0.7 |  | 1 | 0.7 |  |
|  |  |  |  |  |  |  |  |
| Rx |  |  |  |  |  |  |  |
| y_l_a |  | na | | | na | | |
| wsf |  | notch 1 | notch 2 | notch 3 | notch 1 | notch 2 | notch 3 |
|  | zero f [Hz] | nu | nu | nu | 30 |  |  |
|  | zero damp |  |  |  | 0.1 |  |  |
|  | pole f [Hz] |  |  |  | 30 |  |  |
|  | pole damp |  |  |  | 0.55 |  |  |

LITHOGRAPHIC APPARATUS, DEVICE MANUFACTURING METHOD, AND DEVICE MANUFACTURED THEREBY

BACKGROUND OF THE INVENTION

This application claims priority from EP Application Number 00302996.4 which is herein incorporated by reference.

1. Field of the Invention

The present invention relates to the control of leveling, for example of the substrate and/or mask, during exposures in lithographic apparatus. More particularly, the invention relates to a system for leveling control in a lithographic projection apparatus comprising:

- a radiation system for supplying a projection beam of radiation;
- a support structure for supporting patterning means, the patterning means serving to pattern the projection beam according to a desired pattern;
- a substrate table for holding a substrate; and
- a projection system for projecting the patterned beam onto a target portion of the substrate;
  - a level sensor for measuring at least one of a perpendicular position and tilt about at least one parallel axis of a surface of an object held by one of the support structure and the substrate table, and generating a position signal indicative thereof, perpendicular referring to a direction substantially perpendicular to the said surface and parallel referring to a direction substantially parallel to said surface; and
  - a servo system responsive to said position signal for moving said object to a desired position.

2. Description of the Related Art

The term "patterning structure", "patterning means" or "mask" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning means include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from United States Patents U.S. Pat. Nos. 5,296,891 and 5,523,193, which are incorporated herein by reference. In the case of a programmable mirror array, the said support structure may be embodied as a frame or table, for example, which may be fixed or movable as required.
- A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means or patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

During exposure processes, it is important to ensure that the mask image is correctly focussed on the substrate. Conventionally this has been done by measuring the vertical position of the best focal plane of the aerial image of the mask pattern relative to the projection lens before an exposure or a series of exposures. During each exposure, the vertical position of the upper surface of the substrate relative to the projection lens is measured and the position of the substrate table is adjusted so that the substrate surface lies in the best focal plane. However, known leveling systems have not always been able to effect sufficiently accurate positioning of the substrate surface in the best focal plane and can cause undesirable X and Y movements of the substrate due to cross-talk from Rx and Ry leveling adjustments. Such X and Y movements cause overlay errors which are particularly undesirable.

SUMMARY OF THE INVENTION

An object of the present invention is to provide a control system capable of improved "on-the-fly" leveling (that is leveling based on position measurements made during the exposure rather than in advance) performed on a substrate or mask in a lithographic projection apparatus during exposure processes and in particular to reduce focussing errors, cross-talk between tilts and horizontal shifts and unnecessary object table movements.

This and other objects are achieved according to the invention in a lithographic projection apparatus as specified in the opening paragraph, characterized by a filter connected between said level sensor and said servo system for filtering said position signal.

The present invention, by interposing a filter between the level sensor and the servo system for leveling, enables improvements in the leveling performance. In particular, undesirable movements to follow high spatial frequency (height) variations in the substrate surface can be avoided. Also, trade-offs between performance in different degrees of freedom can be made, especially to avoid cross-talk into horizontal displacements of the substrate which would result in overlay errors. Preferably, the level sensor, optionally in cooperation with a position sensor such as an interferometer or a Linear Variable Differential Transformer (LVDT) measurement system, generates a setpoint which the servo system aims to follow. The filter then filters that setpoint.

According to a further aspect of the present invention there is provided a device manufacturing method comprising the steps of:

providing a substrate that is at least partially covered by a layer of radiation-sensitive material;

providing a projection beam of radiation using a radiation system;

using patterning means to endow the projection beam with a pattern in its cross-section;

measuring at least one of a perpendicular position and tilt about at least one parallel axis of a surface of an object held by one of said support structure and said substrate table, and for generating a position signal indicative thereof, perpendicular referring to a direction substantially perpendicular to the said surface and parallel referring to a direction substantially parallel to said surface;

providing a servo system responsive to said position signal for moving said object to a desired position; and projecting the patterned beam of radiation onto a target portion of the layer of radiation-sensitive material whilst operating said servo system to maintain said object at said desired position;

characterized by the step of:

filtering said position signal before it is used by said servo system to control the position of said object.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV or XUV) radiation, e.g. having a wavelength in the range 5–20 nm), as well as particle beams, such as ion beams or electron beams.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION OF THE INVENTION

Embodiment 1

Figure 1:
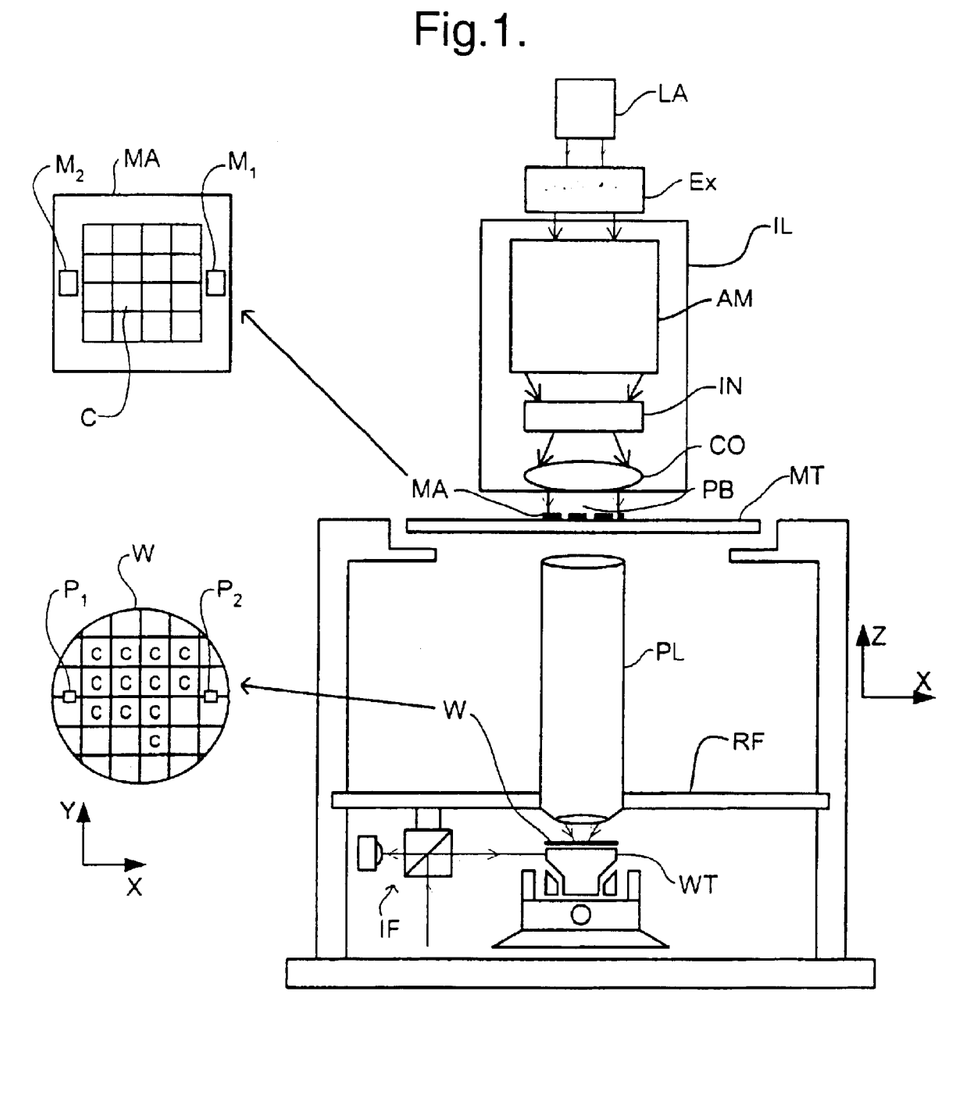
FIG. 1 depicts a lithographic projection apparatus according to a first embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV or EUV radiation, electrons or ions). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of deflectors) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a Hg lamp, excimer laser, an undulator provided around the path of an electron beam or storage ring or synchrotron, a laser-produced plasma source, a discharge source or an electron or ion beam source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately e.g., so as to position different target portions C in the path of the beam PB using wafer alignment marks P1, P2. Similarly, the first positioning means can be used to accurately position the mask MA using mask alignment marks M1, M2 with respect to the path of the beam PB, e.g., after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short-stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

An important factor influencing the imaging quality of a lithographic apparatus is the accuracy with which the mask pattern image is focused on the substrate. In practice, since the scope for adjusting the position of the focal plane of the projection system PL is limited and the depth of focus of that system is small, this means that the target portion of the wafer (substrate) must be positioned precisely in the focal plane of the projection system PL. To do this, it is of course necessary to know both the position of the focal plane of the projection system PL and the position of the top surface of the wafer. Wafers are generally polished to a very high degree of flatness but nevertheless deviation of the wafer surface from perfect flatness (referred to as "unflatness") of sufficient magnitude to affect focus accuracy can occur. Unflatness may be caused, for example, by variations in wafer thickness, distortion of the shape of the wafer or contaminants on the wafer table. The presence of structures due to previous process steps also significantly affects the wafer height (flatness). In the present invention, the cause of unflatness is largely irrelevant; only the height of the top surface of the wafer is considered. Unless the context otherwise requires, references below to "the wafer surface" refer to the top surface of the wafer onto which will be projected the mask image.

Figure 2:
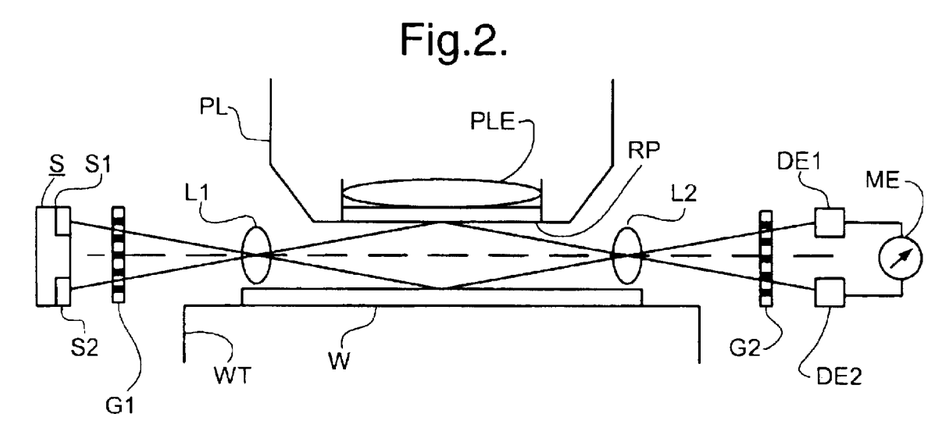
FIG. 2 depicts a level sensor device used in the first embodiment of the invention.

During exposures, the position and orientation of the wafer surface relative to the projection optics PL are measured. The perpendicular, or vertical, position (Z) and parallel, or horizontal, tilts (Rx, Ry) of the wafer table WT are adjusted to keep the wafer surface at the optimal focus position. The perpendicular, or vertical, position refers to the position along an axis substantially perpendicular to the plane of the wafer surface, and the parallel, or horizontal, tilts refer to tilts along at least one axis parallel to the plane of the wafer surface. The detector, referred to herein as the level sensor, which may be used for this is shown in FIG. 2. It comprises a radiation source S which has two emitting areas S1, S2 and supplies two beams, a reference beam and a measurement beam having a wide wavelength band. Also shown are an object grating GI and an image grating G2. Optical systems (depicted for clarity as simple lenses) L1 and L2 image the object grating G1 onto the image grating G2, the reference beam having been reflected by the outer surface RP of the projection optics PL and the measurement beam by the wafer surface. Detectors DE2, DE1 behind the image grating G2 give, when irradiated, signals which can be measured by a meter ME or other suitable instrument, indicative of the relative positions of the points where the reference beam and measurement beam are reflected by the projection optics PL and wafer surface respectively. By using more than one such system, e.g. four, the relative heights of a corresponding number of points on the wafer surface can be measured and local tilts of the wafer surface determined. The level sensor is described in greater detail in EP-0 502 583-A and U.S. Pat. No. 5,191,200, for example, which documents are incorporated herein by reference.

Figure 3:
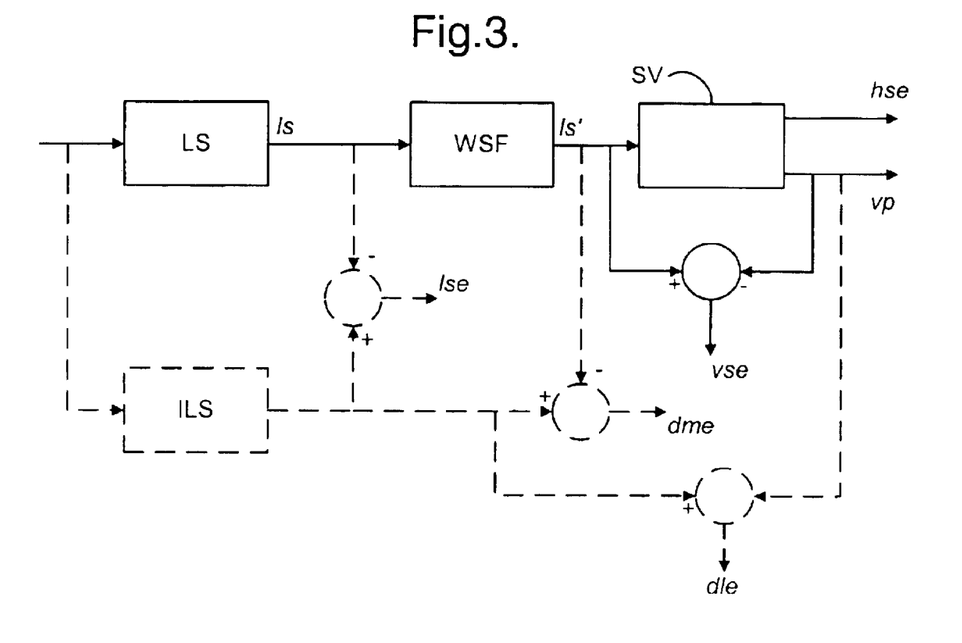
FIG. 3 is a diagram of a control system used in the first embodiment of the invention.

A schematic of the leveling control system is shown in FIG. 3. The physical components of the system are the level sensor LS, wafer shape filter WSF and servo system SV. The servo system SV is a closed-loop system, including necessary control circuitry, a mechanism for driving the wafer table and a positioning system. The level sensor output ls is filtered by the wafer shape filter WSF to give a filtered signal ls' which forms the setpoint of the servo system. The servo system drives the wafer table WT to a vertical position vp and may introduce a horizontal servo error hse in the horizontal position of the wafer. Such an error can be caused by a non-zero Abbe arm for the Rx and Ry rotations carried out by the servo system, for example. In other words, the servo system rotates the wafer table about axes not lying exactly on the wafer surface. Any error vse in the vertical position signals output by the servo system SV can be measured by subtracting the filtered level sensor signal ls' from the measured vertical position vp (vp is measured using an interferometer or LVDT, for example). These components and their interconnections are shown in solid in FIG. 3. It should be noted that leveling of the wafer is carried out in three degrees of freedom; vertical (Z) position and rotation about orthogonal horizontal axes (Rx and Ry). FIG. 3, and some later Figures showing other embodiments of the invention, show general control architectures applicable for all three degrees of freedom Z, Rx and Ry. Unless the context otherwise requires, signals such as ls, ls', Zif, etc., include data of those three degrees of freedom.

The transfer function H_ls of the level sensor LS is not ideal. If an ideal level sensor ILS is notionally introduced into the system then the various possible errors in the complete system can be identified. Since the ideal level sensor cannot be built, such an ideal sensor and the errors derived by reference to it are shown in phantom in FIG. 3. These errors are the level sensor error lse, dynamic measurement error dme and dynamic leveling error dle. Thus the errors in the leveling system may be defined as:

$$\text{lse} = \text{wafer} \cdot H\_\text{ils} - \text{wafer} \cdot H\_\text{ls} \qquad (1)$$

$$\text{dme} = \text{wafer} \cdot H\_\text{ils} - \text{wafer} \cdot H\_\text{ls} \cdot H\_\text{wsf} \qquad (2)$$

$$\text{vse} = \text{wafer} \cdot H\_\text{ls} \cdot H\_\text{wsf} - \text{wafer} \cdot H\_\text{ls} \cdot H\_\text{wsf} \cdot H\_\text{sv} \qquad (3)$$

$$\text{dle} = \text{wafer} \cdot H\_\text{ils} - \text{wafer} \cdot H\_\text{ls} \cdot H\_\text{wsf} \cdot H\_\text{sv} \qquad (4)$$

$$\text{hse} = \text{wafer} \cdot H\_\text{ls} \cdot H\_\text{wsf} \cdot H\_\text{sv} \qquad (5)$$

where H_aa is the transfer function of element AA in the control system. These various transfer functions will in general be functions of Z, Rx and Ry and may include terms representing cross-talk into other degrees of freedom. Of these errors, the first four are defined for Z, Rx, Ry and Ztotal, the last only for X and Y. Ztotal is a combination of Z, Rx and Ry errors in such a way that it represents the maximal Z displacement in the radiation system's exposure slit, effectively the maximum Z error on one of the four corners of the slit. Ztotal is calculated as Z±Rx.slitsizeY/2±Ry.slitsizeX/2. SlitsizeY is defined as the width of said projection beam in a scanning direction of one of the support structure and the wafer table, and slitsizeX refers to a width of said projection beam in a direction substantially perpendicular to the said scanning direction.

The transfer function H_wsf of the wafer shape filter is determined for each application to provide the desired improvements to the above errors. For example, the transfer function H_wsf may be empirically derived to compensate for the divergence of the transfer function H_ls of the actual level sensor LS and so reduces the dynamic measurement error dme to zero. The ideal level sensor transfer function has a magnitude that decreases with spatial frequency, and a first zero-crossing at a spatial frequency equal to the inverse of the width of the exposure slit in the scan direction (in the case of a step-and-scan apparatus). This is advantageous as it prevents the wafer table attempting to follow variations in the wafer surface of wavelength shorter than the slit width and in particular reduces undesired horizontal movements due to high-frequency cross-talk.

The wafer shape filter transfer function can also be adjusted to compensate for or compromise between the other errors. Appropriate forms for the wafer shape filter transfer function to achieve the desired effects can be derived empirically or by modeling the servo system. For example, in one servo system it was determined that Y errors were out of specification whilst Ztotal and Rx errors were comfortably within limits. A notch filter in the Rx wafer shape filter transfer function with a center frequency equal to the peak frequency of the Y moving average error was found to improve Y accuracy at an acceptable cost to Rx and Ztotal. The damping coefficients were selected to provide the desired improvement in Y while reducing the cost to Rx and Ztotal.

Embodiment 2

Figure 4:
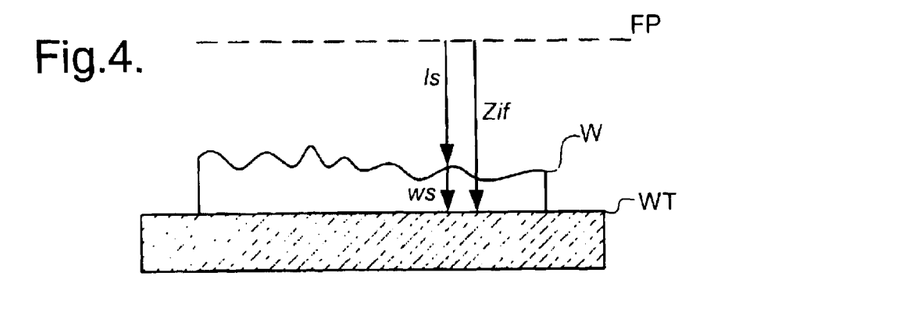
FIG. 4 is a diagram used to explain measurements used in a second embodiment of the invention.
Figure 5:
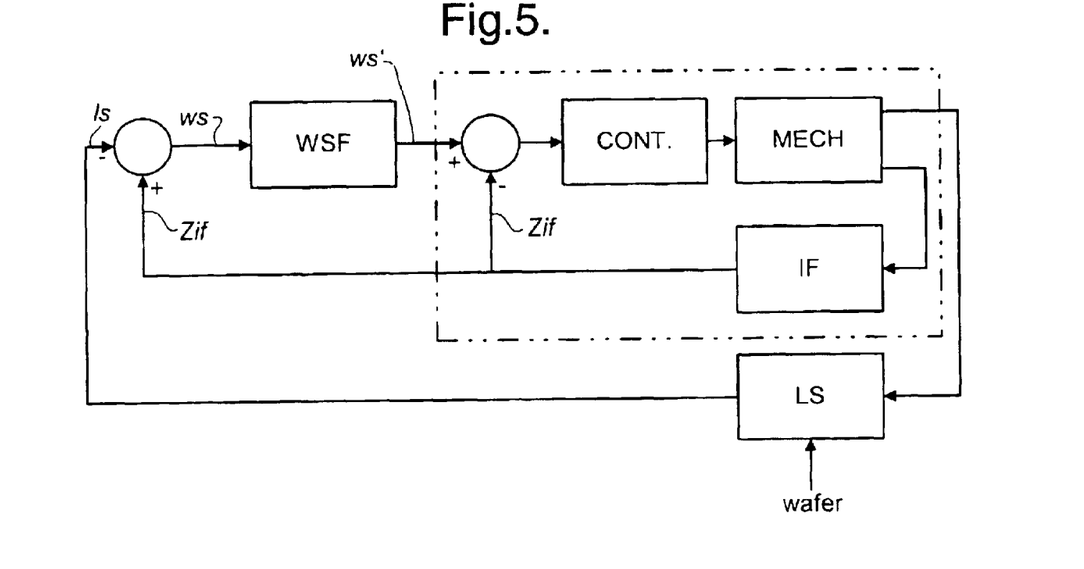
FIG. 5 is a diagram of a control system used in a second embodiment of the invention.

In a second embodiment, shown in FIG. 5, the control system makes use of information indicating the position of the wafer table WT provided by an interferometric displacement measurement system IF. Suitable three, five and six-axis interferometric metrology systems are described in WO99/28790 and WO99/32940, for example, which are incorporated herein by reference. An LVDT measurement system may also be used in place of the interferometer. In such a system, three LVDTs are located under the wafer table WT and their outputs transformed to give Z, Rx and Ry data. As shown in FIG. 4, the interferometer system IF measures the position Zif of the wafer table WT (sometimes referred to as the mirror block, as the interferometer system makes use of mirrors bonded to the sides of the wafer table) relative to the focal plane FP of the projection lens system PL while the level sensor measures the height is of the upper surface of the wafer W. (Note that while the ls and Zif measurements are shown spaced apart in FIG. 4 for clarity, in fact the interferometer and level sensor should be arranged to make measurements at the same position in the XY plane.) The interferometer data, though denoted simply Zif includes information regarding the horizontal tilt, Rx and Ry, of the wafer table as well as vertical position, Z. By subtracting the level sensor data from the interferometer data, a value for the wafer shape ws is obtained, i.e.:

$$ws=Zif-ls \quad (6)$$

The control system using the interferometer data is shown in FIG. 5. The control strategy for this system is that the wafer shape filter WSF provides the filtered wafer shape signal ws' which acts as setpoint data for an inner closed-loop control system (within the double dotted line in FIG. 5) comprising controller CONT, the short-stroke table drive system MECH, the interferometer IF and a subtractor which subtracts the position of the wafer table as indicated by the interferometer data Zif from the filtered wafer shape data ws'. In the second embodiment, the wafer shape filter WSF acts on the wafer shape data ws (which represents the actual shape of the wafer) rather than the level sensor data (which includes the instantaneous position of the wafer table). The inner loop has a high bandwidth, e.g. 50 or 100 Hz or more, and is able to follow the wafer shape setpoint ws' accurately. The outer loop determines the setpoint by filtering the wafer shape signal ws. The wafer shape filter WSF will therefore not affect the performance of the inner loop. The outer loop needs to be stable and to have limited closed-loop amplification.

As in the first embodiment, the wafer shape filter is selected to correct measurement errors in the level sensor LS and to reduce vertical (tilt) to horizontal cross-over.

Embodiment 3

Figure 6:
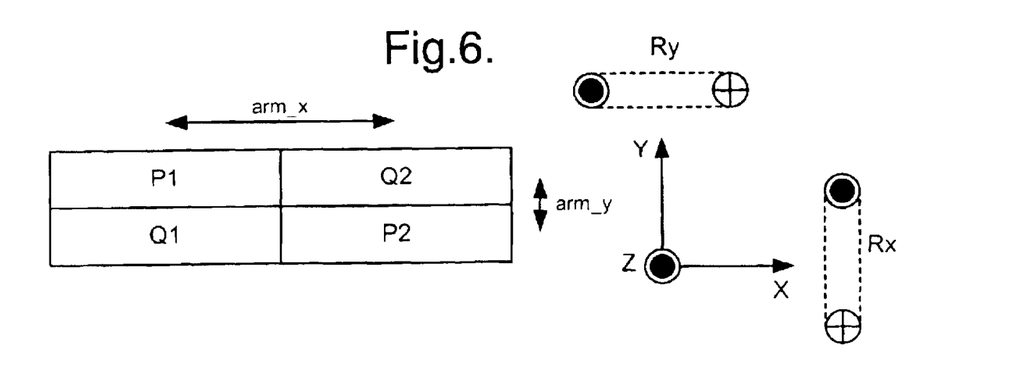
FIG. 6 is a diagram showing the relative positions of measurement spots used in a third embodiment of the invention.

A third embodiment of the invention is described with reference to FIGS. 6 and 7. The third embodiment incorporates so-called "look-ahead" in the level sensor LS to compensate for delay which is caused in the wafer shape filter. The level sensor including look-ahead is denoted LS' and utilizes a measurement spot pattern as depicted in FIG. 6. Measurement spots P1 and Q2 are positioned ahead of the center of the projection lens while Q1 and P2 are behind. The corresponding signals are denoted as ZP1, ZQ2, ZQ1, ZP2, respectively. With this 4-spot layout, sensor look-ahead for Z and Ry position is effected by weighting the advance spot measurements more heavily than the back spots. (Note that sensor 20 look-ahead is not used in Rx because Rx measurements require both advance and back spot measurements.) Without sensor look-ahead, center level sensor Z, Rx and Ry signals are calculated as follows:

$$ls\_centZ=(ZP1+ZP2+ZQ1+ZQ2)/4 \quad (7)$$

$$ls\_centRx=((ZP1+ZQ2)/2-(ZP2+ZQ1)/2)/\text{arm}\_y \quad (8)$$

$$ls\_centRy=((ZP1+ZQ1)/2-(ZP2+ZQ2)/2)/\text{arm}\_x \quad (9)$$

To calculate look-ahead in Z and Ry, gradient values are defined as follows:

$$ls\_gradZ=dz/dy=ls\_centRx \quad (10)$$

$$ls\_gradRx=0 \quad (11)$$

$$ls\_gradRy=dRy/dy=((ZP1-ZQ2)/\text{arm}\_x-(ZQ1-ZP2)/\text{arm}\_x))/\text{arm}_{13}\,y \quad (12)$$

The look-ahead level sensor readings are then:

$$ls\_frontZ=ls\_centZ+y\_l\_aZ.\,ls\_gradZ \quad (13)$$

$$ls\_frontRx=ls\_centRx \quad (14)$$

$$ls\_frontRy=ls\_centRy+y\_l\_aRy.\,ls\_gradRy \quad (15)$$

where y_l_a is the look-ahead distance which can be different for Z and Ry.

Figure 7:
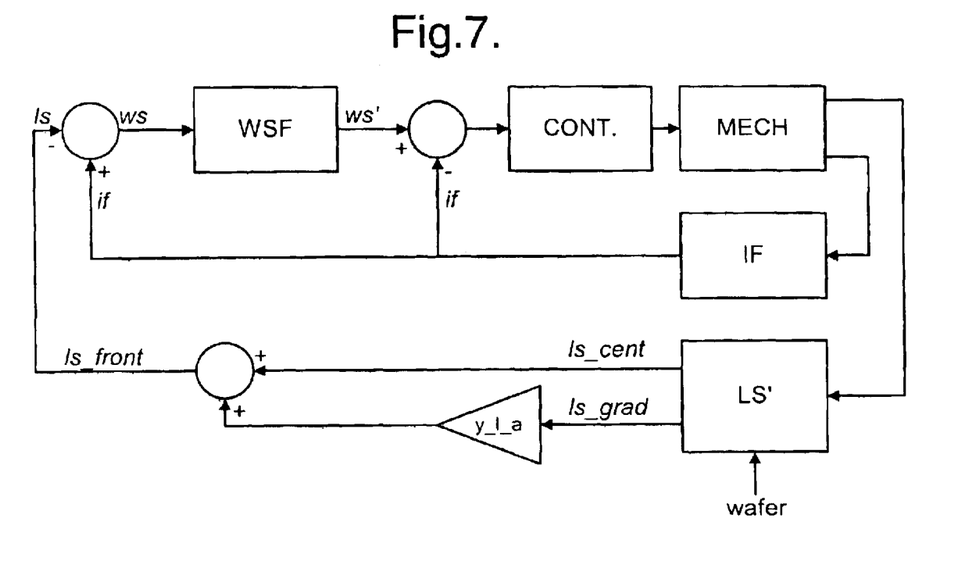
FIG. 7 is a diagram of a control system used in the third embodiment of the invention.

The control system, shown in FIG. 7, is then essentially the same as that of the second embodiment, shown in FIG. 5, save that the level sensor LS' is adapted to provide the gradient signals, and a look-ahead multiplier y_l_a and adder are introduced to generate the sensor look-ahead data.

Embodiment 4

Figure 8:
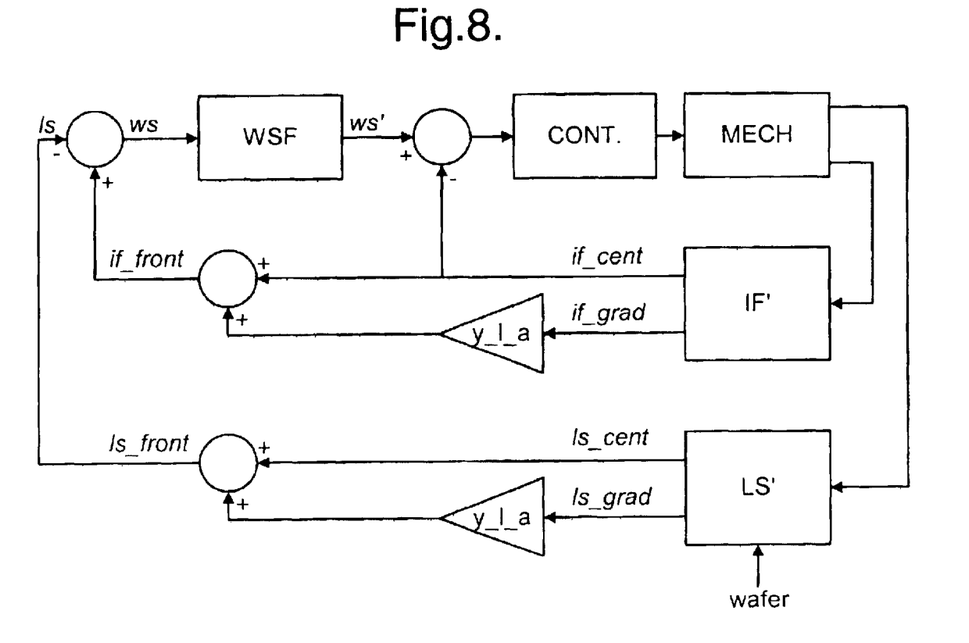
FIG. 8 is a diagram of a control system used in a fourth embodiment of the invention.

The fourth embodiment, which is shown in FIG. 8, is similar to the third but includes look-ahead in the interferometer IF, or LVDT measurement system, as well. This avoids errors in ls_frontZ which may occur in the third embodiment when there is a significant Rx tilt. In the third embodiment, the Z level sensor front signal and the Z interferometer signal are not measured at exactly the same spot so that there will be an error in the Z wafer shape signal ws if there is a significant Rx tilt. Accordingly, an interferometer gradient is defined for the Z signal, as follows:

$$\text{ifm\_gradZ} = \text{ifm\_centRx} \quad (16)$$

The forward-measured interferometer Z signal is then:

$$\text{ifm\_frontZ} = \text{ifm\_centZ} + y\_l\_aZ. \text{ifm\_gradZ} \quad (17)$$

Note that the interferometer gradients for Rx and Ry are defined as zero so that the corresponding look-ahead signals are equal to the center signals.

The resulting control system architecture is shown in FIG. 8; it corresponds to that of the third embodiment save for the additional multiplier and adder to generate the if_front signals.

Embodiment 5

Figure 9:
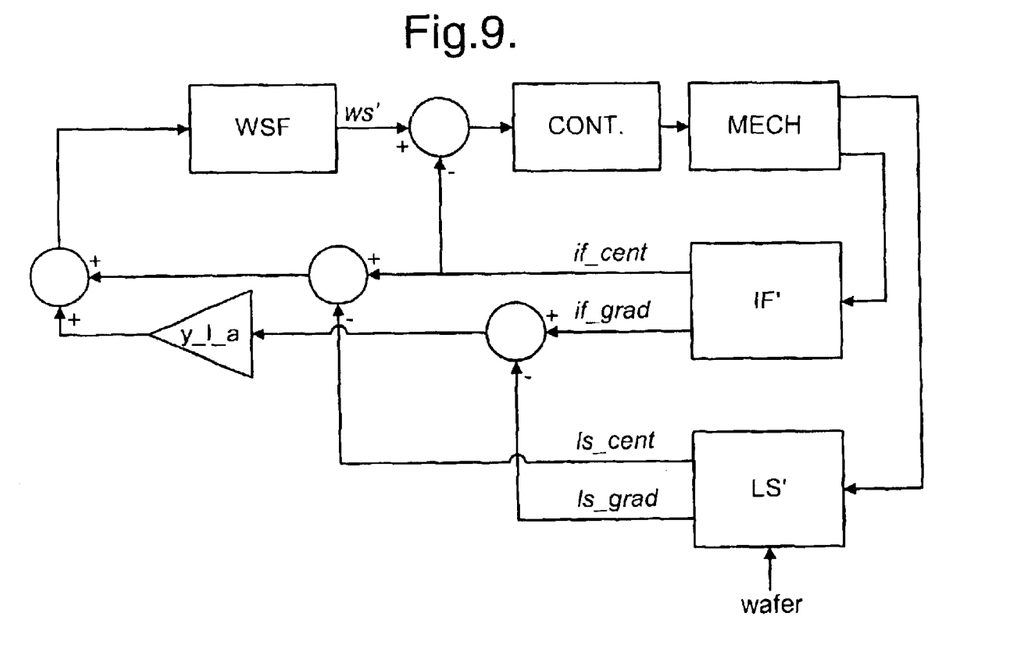
FIG. 9 is a diagram of a control system used in a fifth embodiment of the invention.

The control system architecture of a fifth embodiment of the invention is shown in FIG. 9. This arrangement is effectively the same as the fourth embodiment but, by subtracting the center and gradient signals before multiplication by y_l_a, one multiplier is saved.

Embodiment 6

Figure 10:
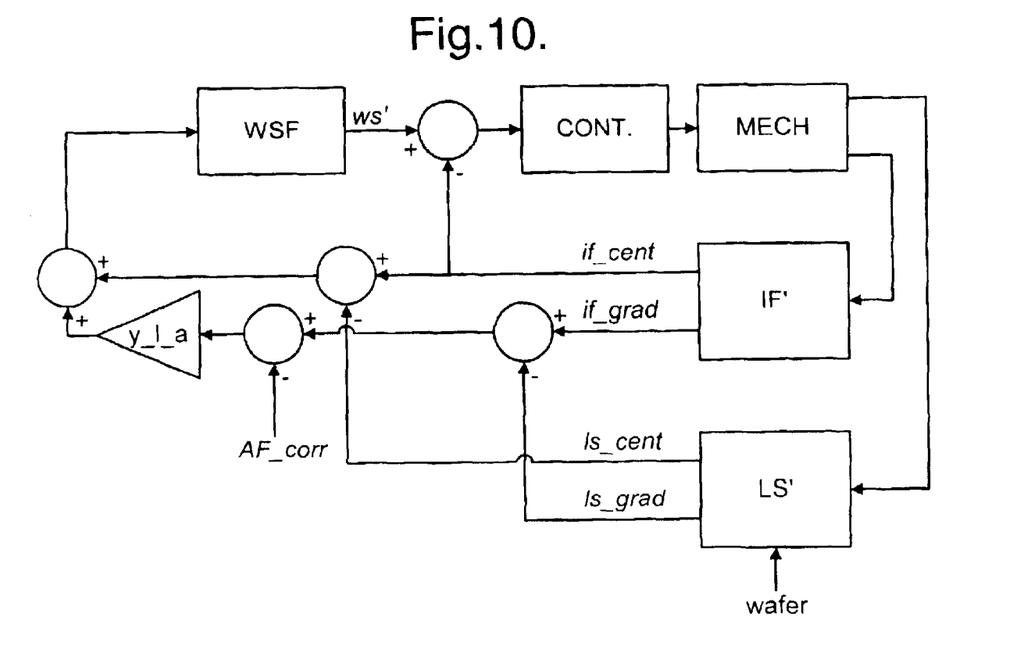
FIG. 10 is a diagram of a control system used in a sixth embodiment of the invention.
Figure 11A:
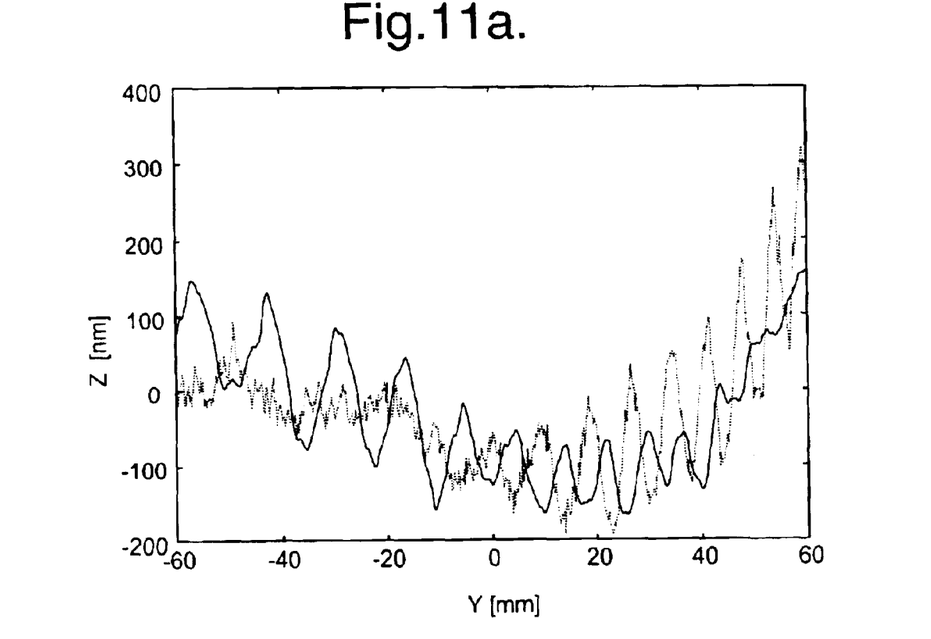
FIGS. 11A and B are graphs showing Z positions of a wafer table during scanning of a test wafer with a conventional apparatus and with an apparatus embodying the invention.
Figure 11B:
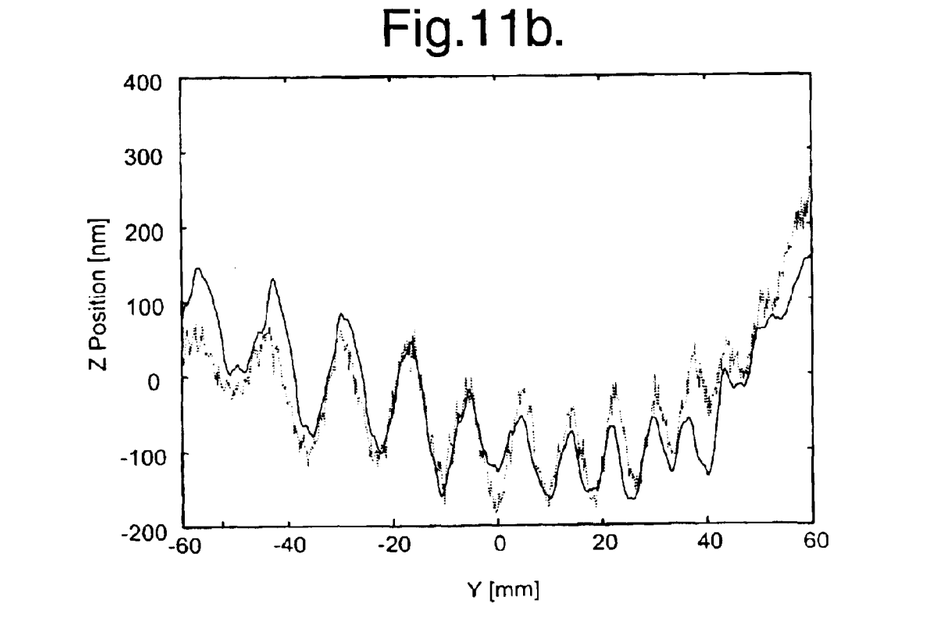
Figure 12A:
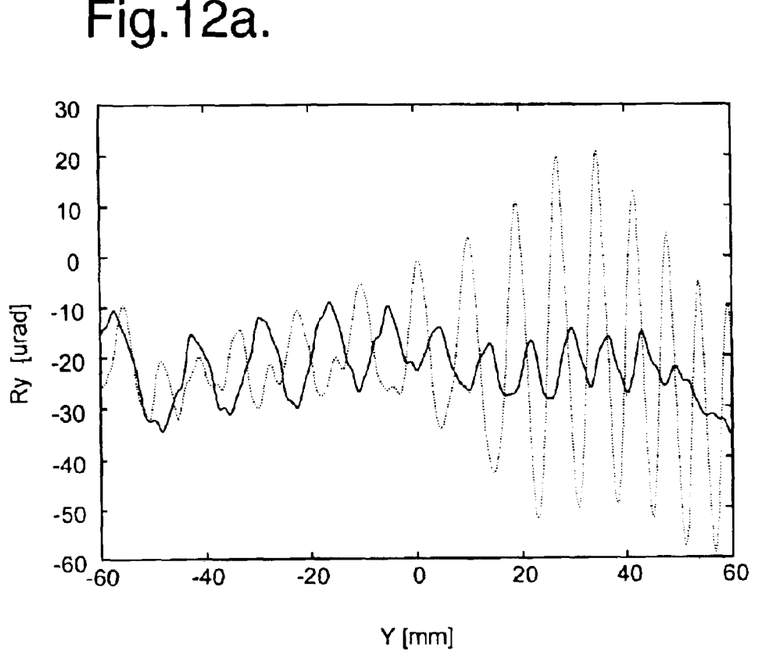
FIGS. 12A and B are graphs showing Ry positions of a wafer table during scanning of a test wafer with a conventional apparatus and with an apparatus embodying the invention.
Figure 12B:
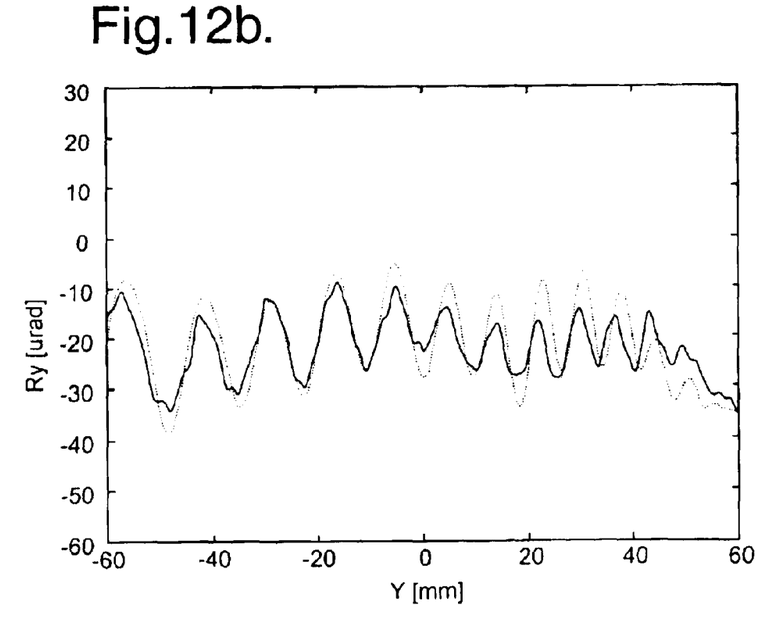
Figure 13A:
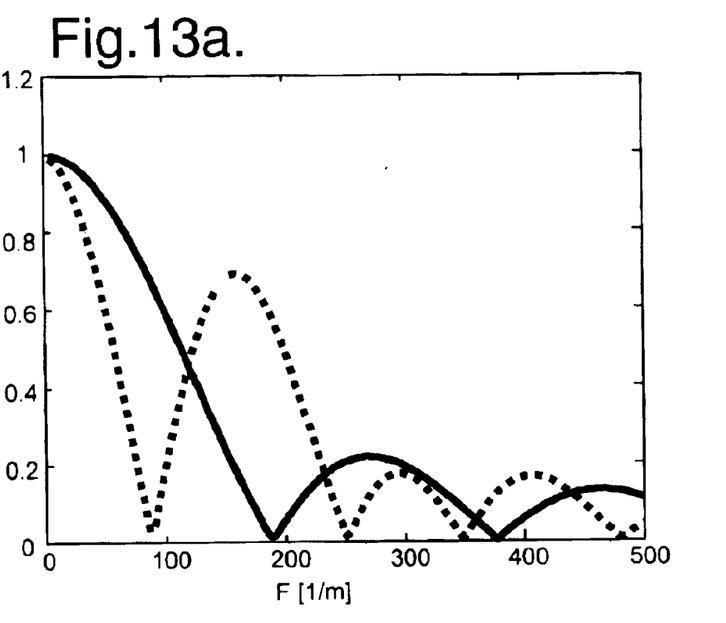
FIGS. 13A and B are graphs showing Z position level sensor transfer functions of a conventional level sensor and a level sensor with filtering according to the invention, in each case compared to an ideal level sensor.
Figure 13B:
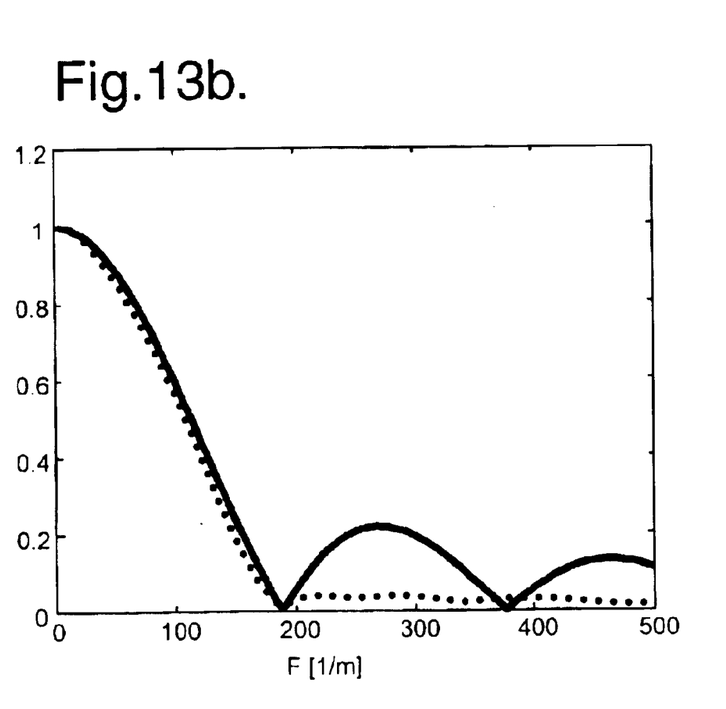
Figure 14A:
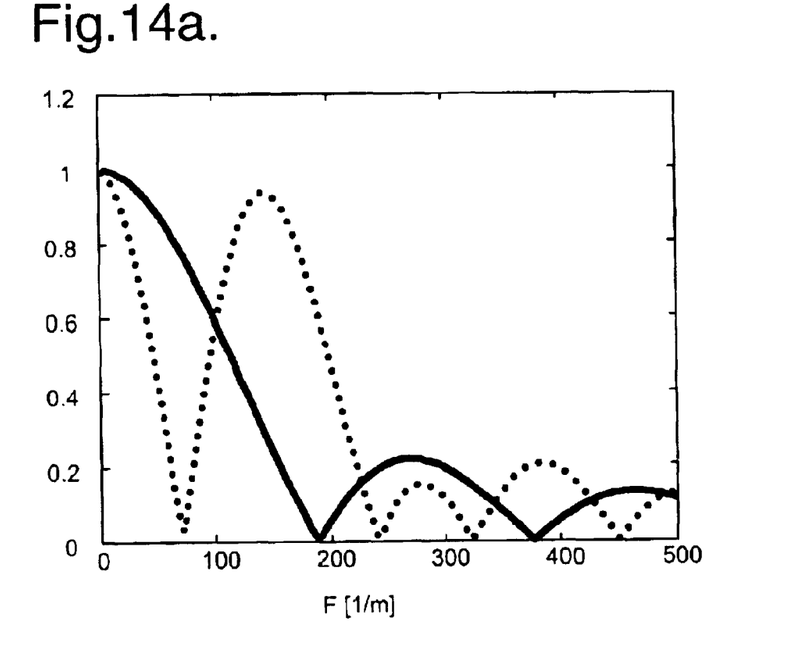
FIGS. 14A and B are graphs showing Ry position level sensor transfer functions of a conventional level sensor and a level sensor with filtering according to the invention, in each case compared to an ideal level sensor.
Figure 14B:
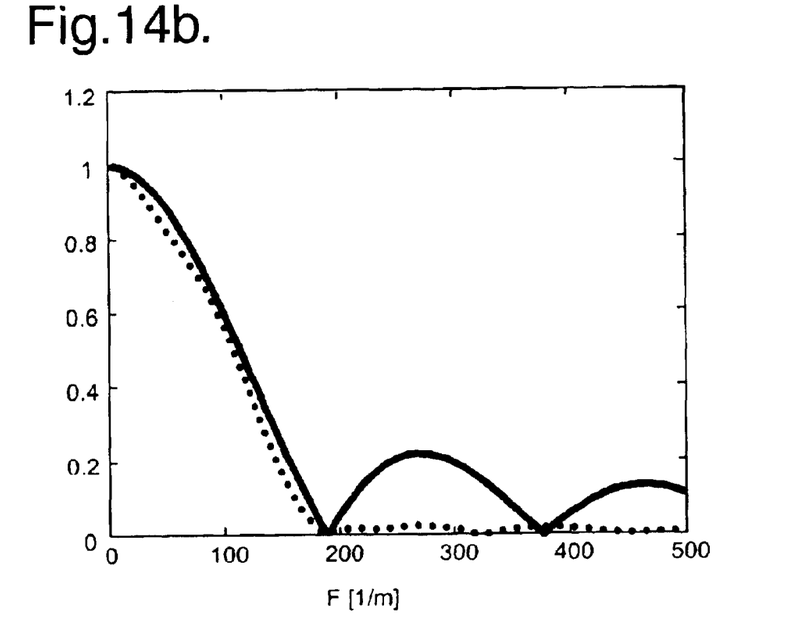

A sixth embodiment of the invention is shown in FIG. 10. The sixth embodiment incorporates an additional correction AF_corr to compensate for changes in the position of the actual best focal plane. Such changes may be effected deliberately or may be caused by temperature variations in the elements of the projection optical system PL and temperature or pressure variation in the gas or air filling the projection optical system PL. A measured or predicted change of the actual focal plane in Z or Ry is automatically compensated for in the level sensor LS' which measures the position of the wafer surface relative to the optimum focal plane. However, a change of the optimum focal plane in Rx will, with sensor look-ahead, result in an error in the Z position of the wafer surface. To prevent this, the wafer shape Z value is corrected by $-\Delta Rx. y\_l\_a$, where $\Delta Rx$ is the change in the position of the optimum focal plane, or the Z gradient is corrected by $-\Delta Rx$. The latter alternative is effected in the sixth embodiment in which AF_corr is subtracted from the differential gradient signal if_grad-ls_grad. AF_corr is defined as $\Delta Rx$ for Z and zero for Rx and Ry.

EXAMPLES

Figure 15:
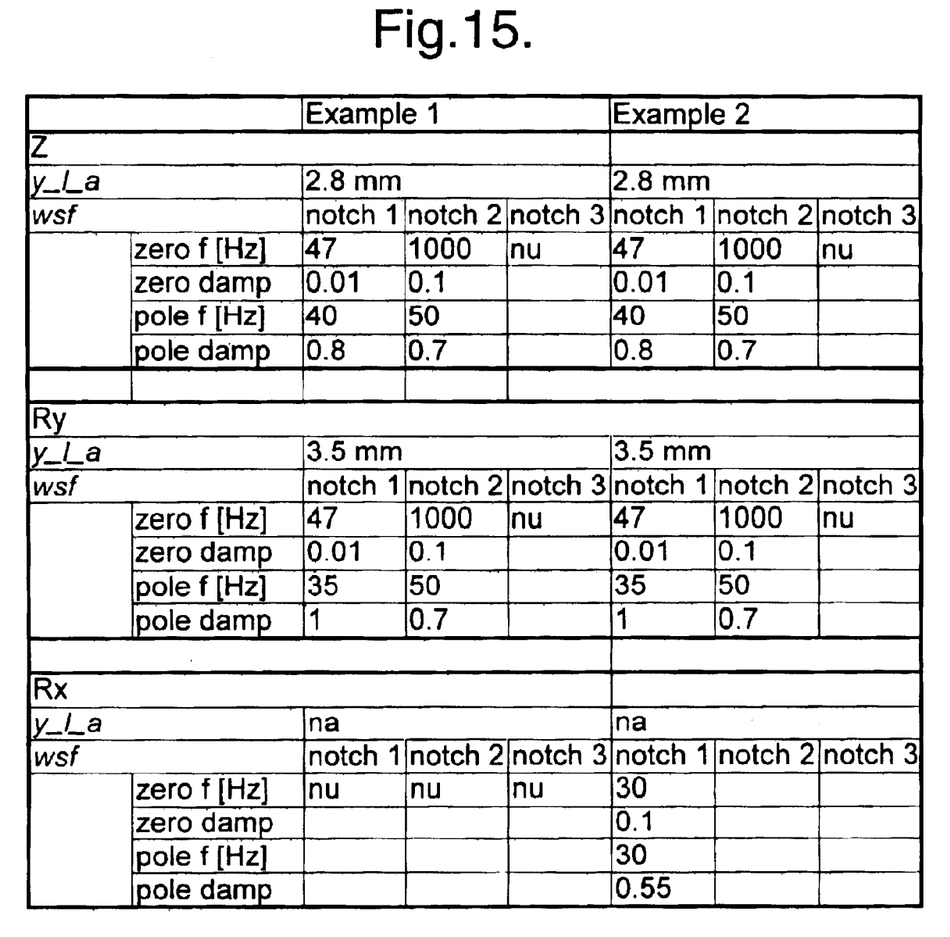
FIG. 15 is a table of wafer shape filter settings in two examples of the invention.

To demonstrate the effectiveness of the present invention the servo architecture of the sixth embodiment was used with a fourth order wafer shape filter comprising two second order notch filters. The filter and look-ahead settings for Z, Rx and Ry for two examples, Example 1 and Example 2, are shown in FIG. 15. In FIG. 15, "nu" indicates "not used" and "na" indicates "not available".

In Example 1, no Rx wafer shape filter was used and the wafer shape filter acts on a time series of values representing heights at positions spaced in the Y (scanning) direction. However in Example 2, an Rx filter was added to the filter of example 1 to improve the Y performance at the expense of Rx performance. Simulations were carried out using test data derived from a sample of six test wafers. In the simulations, moving averages (MA) and moving standard deviations (MSD) for servo errors in Ztotal, Z, Rz, Ry, X and Y, as well as dynamic leveling errors in Ztotal, Z, Rx and Ry, were calculated, i.e. a total of 120 values. As compared to leveling without any wafer shape filtering, Example 1 reduced the number of out-of-spec results from 20 to 11 whilst Example 2 reduced this to 1.

The wafer shape filter settings of Examples 1 and 2 are based on a scanning speed of 250 mm/s. For other scanning speeds, the look-ahead distances and filters can be adapted, e.g. so as to maintain a constant look-ahead time, rather than distance. Similarly, the frequency values of the wafer shape filter can be made proportional to scanning speed so that they represent constant spatial frequencies.

The effectiveness of the present invention is further demonstrated by FIGS. 11 to 14 which show test results obtained using the filter of Example 1 and a test wafer with a special (waved) step topology. In the negative X half of the wafer the surface has a step topology with decreasing wavelength in the Y direction. The positive X half is flat. FIGS. 11A and 11B show actual Z position movements (dashed) on this wafer compared to ideal (solid), without and with wafer shape filtering respectively. FIGS. 12A and 12B show actual Ry movements (dashed) compared to ideal (solid), without and with wafer shape filtering respectively. FIGS. 13A and 13B show actual Z level sensor transfer functions (dashed) compared to ideal (solid), without and with wafer shape filtering respectively. FIGS. 14A and 14B show actual Ry level sensor transfer functions (dashed) compared to ideal (solid), without and with wafer shape filtering respectively. It can readily be seen that with the invention the transfer functions and wafer movements are considerably closer to the ideal. In particular, undesirable high-frequency movements of the wafer table are avoided.

As mentioned above, the actual form of the filter will be determined according to the specific embodiment of the invention and the desired performance criteria. One approach to selection of a suitable filter is to first find a level sensor look-ahead distance which ensures that the look-ahead transfer function of the level sensor lies above the ideal transfer function, at least up to the first zero-crossing at 1/slitsizeY. Using a two-notch filter, the first notch is then used to shape the transfer function up to the first zero-crossing. The second notch is used to filter off the frequencies higher than the first zero-crossing and to adjust the phase of the transfer function up to the first zero-crossing.

While we have described above specific embodiments of the invention it will be appreciated that the invention may be practiced otherwise than as described. The description is not intended to limit the invention. It should be explicitly noted that the current invention can be applied to substrate leveling alone, to mask leveling alone, or to a combination of substrate leveling and mask leveling.

What is claimed is:

1. A lithographic projection apparatus comprising:
    a radiation system for supplying a projection beam of radiation;
    a support structure for holding patterning structure, the patterning structure serving to pattern the projection beam according to a desired pattern;
    a substrate table for holding a substrate;
    a projection system for projecting the patterned beam onto a target portion of the substrate;
    a level sensor for measuring at least one of a perpendicular position and tilt about at least one parallel axis of a surface of an object held by one of the support structure and the substrate table, and generating a position signal indicative thereof, perpendicular referring to a direction substantially perpendicular to the said surface and parallel referring to a direction substantially parallel to said surface;
    a servo system responsive to said position signal for moving said object to a desired position; and
    a filter connected between said level sensor and said servo system for filtering said position signal, the filter having a transfer function representative of a difference between an actual measurement of the level sensor and an ideal measurement of the level sensor.

2. Apparatus according to claim 1, wherein the filtered position signal forms a setpoint for said servo system.

3. Apparatus according to claim 2, wherein said filter is a low-pass filter arranged to pass components of said position signal having a spatial frequency lower than a predetermined spatial frequency.

4. Apparatus according to claim 3, wherein at least one of the support structure and the substrate table are moveable to effect a scanning exposure of a substrate held on said substrate table, and said predetermined spatial frequency is substantially equal to 1 divided by the width of said projection beam in the scanning direction of the apparatus.

5. Apparatus according to claim 1, wherein said filter is adapted to reduce cross-talk between rotation of said object about a parallel axis and parallel translations of said object.

6. Apparatus according to claim 1, further comprising a position sensor for detecting a position of said at least one of said support structure and said substrate table, an output of said position sensor being subtracted from an output of said level sensor to form said position signal; and wherein said servo system comprises an inner control loop including said position sensor for controlling the position of said at least one of said support structure and said substrate table, and said filtered position signal forms a setpoint for said inner control loop.

7. Apparatus according to claim 6, wherein said position sensor comprises an interferometric displacement measuring system or a Linear Variable Differential Transformer (LVDT) measuring system.

8. Apparatus according to claim 1, wherein at least one of said support structure and said substrate table are moveable to effect a scanning exposure of a substrate held on said substrate table, and said level sensor is arranged to measure at least one of the perpendicular position and the tilt about at least one parallel axis of a measurement point on said surface of said object ahead of the center of said projection beam in the scanning direction.

9. Apparatus according to claim 8 further comprising a position sensor for detecting a position of said at least one of said support structure and said substrate table, an output of said position sensor being subtracted from an output of said level sensor to form said position signal; and wherein said servo system comprises an inner control loop including said position sensor for controlling the position of said at least one of said support structure and said substrate table, and said filtered position signal forms a setpoint for said inner control loop, wherein said position sensor is arranged to measure the position of said at least one of said support structure and said substrate table at a point corresponding to said measurement point of said level sensor.

10. Apparatus according to claim 8, wherein the distance of said measurement point ahead of said center of said projection beam is dependent on the speed of said scanning exposure.

11. Apparatus according to claim 8, wherein said filter has a transfer function that is dependent on the speed of said scanning exposure.

12. Apparatus according to claim 1, wherein said object is one of the patterning structure and the substrate held by one of the support structure and substrate table, respectively.

13. Apparatus according to claim 1, wherein the support structure comprises a mask table for holding a mask.

14. A method of manufacturing a device comprising:
providing a substrate that is at least partially covered by a layer of radiation-sensitive material;
providing a projection beam of radiation;
patterning the projection beam to produce a pattern in its cross-section;
measuring at least one of a perpendicular position and tilt about at least one parallel axis of a surface of an object with a level sensor and generating a position signal indicative thereof, perpendicular referring to a direction substantially perpendicular to the said surface and parallel referring to a direction substantially parallel to said surface;
projecting the patterned beam of radiation onto a target portion of the layer of radiation-sensitive material while operating a servo system responsive to said position signal to maintain said object at said desired position; and
filtering said position signal to form a filtered position signal using a filter transfer function representative of a difference between an actual measurement of the level sensor and an ideal measurement of the level sensor before it is used by a servo system to control the position of the object.

15. A device manufactured according to the method of claim 14.

16. A lithographic projection apparatus comprising:
a radiation system for supplying a projection beam of radiation;
a support structure for holding patterning structure, the patterning structure serving to pattern the projection beam according to a desired pattern;
a substrate table for holding a substrate;
a projection system for projecting the patterned beam onto a target portion of the substrate;
a level sensor for measuring at least one of a perpendicular position and tilt about at least one parallel axis of a surface of an object held by one of the support structure and the substrate table, and for generating a position signal as a function of time indicative thereof, perpendicular referring to a direction substantially perpendicular to the said surface and parallel referring to a direction substantially parallel to said surface;
a servo system responsive to said position signal for moving said object to a desired position; and
a filter for correcting the transfer function of the level sensor wherein the filter is, arranged for filtering said position signal in the time domain.

17. A method of manufacturing a device comprising:
providing a substrate that is at least partially covered by a layer of radiation-sensitive material;
providing a projection beam of radiation;
patterning the projection beam to produce a pattern in its cross-section;
measuring at least one of a perpendicular position and tilt about at least one parallel axis of a surface of an object with a level sensor and generating a position signal as a function of time indicative thereof, perpendicular referring to a direction substantially perpendicular to the said surface and parallel referring to a direction substantially parallel to said surface;
projecting the patterned beam of radiation onto a target portion of the layer of radiation-sensitive material while operating a servo responsive to said position signal to maintain said object at said desired position; and
filtering said position signal in the time domain by using a filter transfer function for correcting the transfer function of the level sensor before it is used by said servo system to control the position of the object.

* * * * *

UNITED STATES PATENT AND TRADEMARK OFFICE
CERTIFICATE OF CORRECTION

PATENT NO. : 6,721,036 B2
DATED : April 13, 2004
INVENTOR(S) : Arie Cornelis Scheiberlich et al.

It is certified that error appears in the above-identified patent and that said Letters Patent is hereby corrected as shown below:

Title page,
Item [30], Foreign Application Priority Data, replace
"Apr. 10, 2001 (EP)          00302996" with
-- Apr. 10, 2000 (EP)          00302996 --

Signed and Sealed this

Twenty-fourth Day of August, 2004

JON W. DUDAS
*Director of the United States Patent and Trademark Office*